United States Patent [19]

Minemura

[11] Patent Number: 5,185,577
[45] Date of Patent: Feb. 9, 1993

[54] RECEIVER COIL FOR NUCLEAR MAGNETIC RESONANCE IMAGING APPARATUS

[75] Inventor: Takashi Minemura, Ootawara, Japan

[73] Assignee: Kabushiki Kaisha Toshiba, Japan

[21] Appl. No.: 618,052

[22] Filed: Nov. 26, 1990

[30] Foreign Application Priority Data

Nov. 24, 1989 [JP] Japan .................................. 1-303214
Mar. 20, 1990 [JP] Japan ..................................... 231361

[51] Int. Cl.⁵ ............................................. G01R 33/20
[52] U.S. Cl. .................................... 324/318; 324/322
[58] Field of Search ............... 324/300, 307, 309, 310, 324/311, 312, 313, 318, 322; 128/653 A, 653 SC

[56] References Cited

U.S. PATENT DOCUMENTS

| 4,692,705 | 9/1987 | Hayes ................................. 324/318 |
| 4,784,146 | 11/1988 | Mancuso et al. ..................... 324/318 |
| 4,920,318 | 4/1990 | Misic et al. ........................... 324/322 |

FOREIGN PATENT DOCUMENTS 313213 4/1982 European Pat. Off.
59-180577 11/1984 Japan.

OTHER PUBLICATIONS

Society of Magnetic Resonance in Medicine, Book of Abstracts, vol. 2, Aug. 1988/p. 845, N. Krause et al., "Quadrature-Headcoil and Helmholtz-Type Neckcoil-An Optimized RF Antenna-Pair for Imaging Head, Neck and C-Spine at 1.0 and 1.5T'".
Electro Medica, vol. 55, No. 2, 1987, pp. 61-67, H. Requardt et al., "Helmholtzspulen in der Kernspintomographie".
Magnetic Resonance in Medicine, vol. 3, No. 4, Aug. 1986, pp. 491-501, F. DeLuca et al., "Modified Crossed-Ellipse Radiofrequency Coil for MRI".
Society for Magnetic Resonance Imaging, 7th Meeting, Feb. 1989, p. 61, M. Mehdizadeh et al., "An Open Quadrature Coil for Imaging Sections of the Torso".

Primary Examiner—Michael J. Tokar
Attorney, Agent, or Firm—Limbach & Limbach

[57] ABSTRACT

A receiver coil for a nuclear magnetic resonance imaging apparatus, capable of fulfilling the condition for a satisfactory signal reception completely for the imaging of a region of interest that cannot be placed symmetrically with respect to the central axis of the receiver coil. The receiver coil includes coil element for defining an opening section into which a region of interest is to be inserted, and for receiving a nuclear magnetic resonance signal from the region of interest; and a coil support member for supporting the coil elements in a configuration in which a sensitivity central axis of a region of uniform signal reception sensitivity for the coil elements is located away from a central axis of the opening section. The coil elements are preferably supported in a configuration corresponding to a shape of the region of interest.

18 Claims, 9 Drawing Sheets

RECEIVER COIL FOR NUCLEAR MAGNETIC RESONANCE IMAGING APPARATUS

BACKGROUND OF THE INVENTION

1. Field of the Invention

The present invention relates to a receiver coil for receiving and collecting nuclear magnetic resonance signal in a nuclear magnetic resonance signal.

2. Description of the Background Art

As a receiver coil for a nuclear magnetic resonance imaging apparatus, various types of the receiver coil have been developed for different imaging method and different imaging object shapes. In particular, there are many examples of a receiver coil developed for imaging a spine at a neck portion, a chest portion, or a stomach portion of a patient.

Examples of such a conventional receiver coil are shown in FIGS. 1(A) to 6.

Figure 1A:
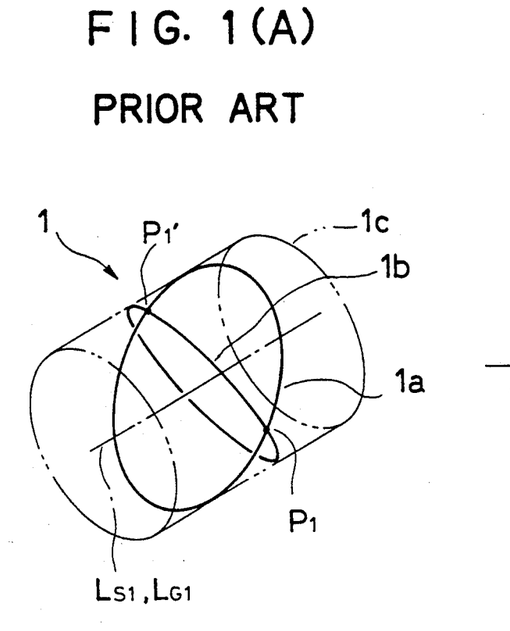
FIGS. 1(A) and 1(B) are a perspective view and a side view, respectively, of one example of a conventional receiver coil.
Figure 1B:
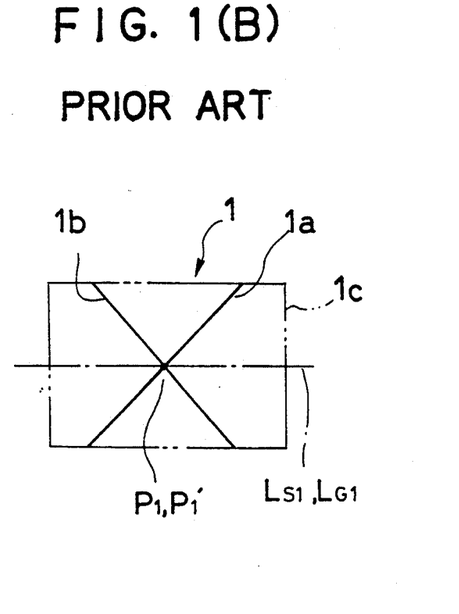

An example of a receiver coil shown in FIGS. 1(A) and 1(B) is called a crossing elliptic coil, and this receiver coil 1 comprises a pair of elliptic coil elements 1a and 1b which are wound around a cylindrical core 1c and are arranged such that they are crossing with each other and electrically connected at cross sections $P_1$ and $P_1'$, where vertical positions of the cross sections $P_1$ and $P_1'$ coincide with that of a center of the cylindrical core 1c, as shown in FIG. 1(B). In this configuration, a sensitivity central axis $L_{S1}$ of a region of uniform signal reception sensitivity and a central axis $L_{G1}$ of the cylindrical core 1c coincide with each other.

Figure 2A:
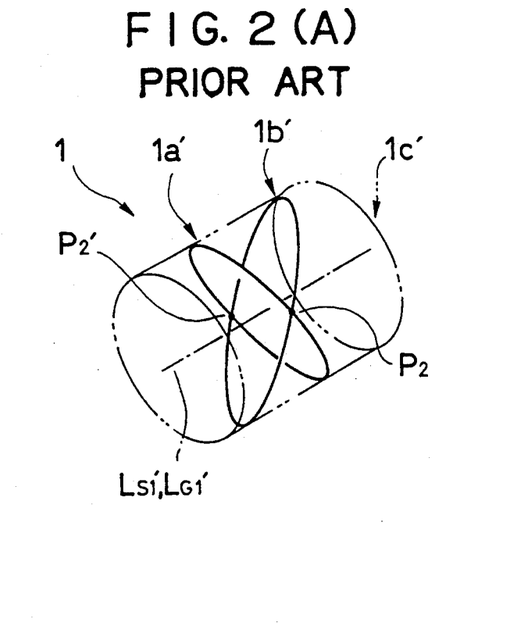
FIGS. 2(A) and 2(B) are a perspective view and a side view, respectively, of another example of a conventional receiver coil.
Figure 2B:
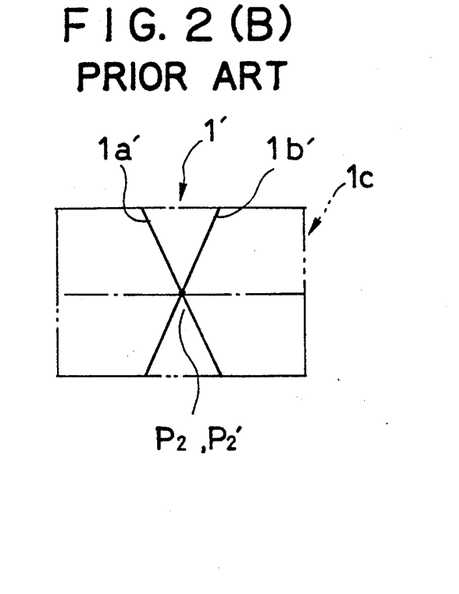

As shown in FIGS. 2(A) and 2(B), the receiver coil 1 of the above example can be modified into a receiver coil 1' which comprises a pair of elliptic coil elements 1a' and 1b' which are wound around a cylindrical core 1c' and are arranged such that they are crossing with each other and electrically connected at cross sections $P_2$ and $P_2'$, where vertical positions of the cross sections $P_2$ and $P_2'$ coincide with that of a center of the cylindrical core 1c', as shown in FIG. 2(B), and where an angle formed between the elliptic coil elements 1a' and 1b' are made narrower than that between the coil elements 1a and 1b in the previous example. In this configuration, a sensitivity central axis $L_{S1}'$ of a region of uniform signal reception sensitivity and a central axis $L_{G1}'$ of the cylindrical core 1c also coincide with each other, as in the previous example. With this configuration, a closer fitting to a patient's body surface becomes possible.

Figure 3:
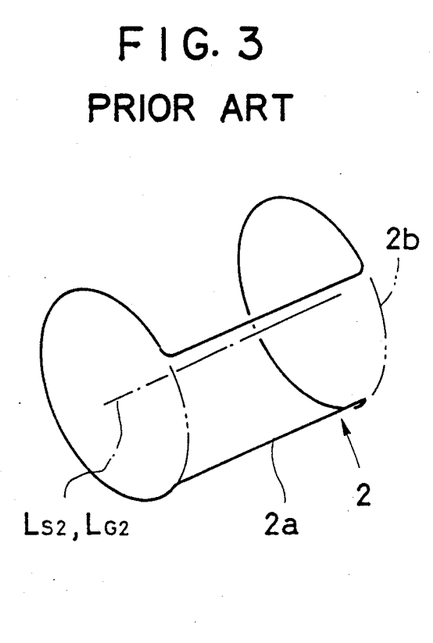
FIG. 3 is a perspective view of another example of a conventional receiver coil.

Another example of a conventional receiver coil is shown in FIG. 3, which is called a saddle coil, and this receiver coil 2 comprises a saddle shaped coil element 2a wound around a cylindrical core 2b. In this configuration, a sensitivity central axis $L_{S2}$ of a region of uniform signal reception sensitivity and a central axis $L_{G2}$ of the cylindrical core 2b also coincide with each other, as in the previous examples.

Figure 4:
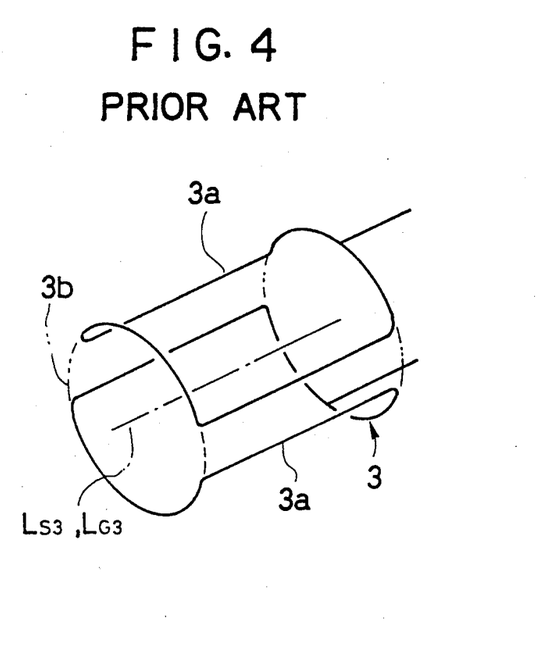
FIG. 4 is a perspective view of another example of a conventional receiver coil.

Another example of a conventional receiver coil is shown in FIG. 4, which is another example of a saddle coil, and this receiver coil 3 comprises a pair of semi-saddle shaped coil elements 3a wound around a cylindrical core 3b. In this configuration, a sensitivity central axis $L_{S3}$ of a region of uniform signal reception sensitivity and a central axis $L_{G3}$ of the cylindrical core 3b also coincide with each other, as in the previous examples.

Figure 5:
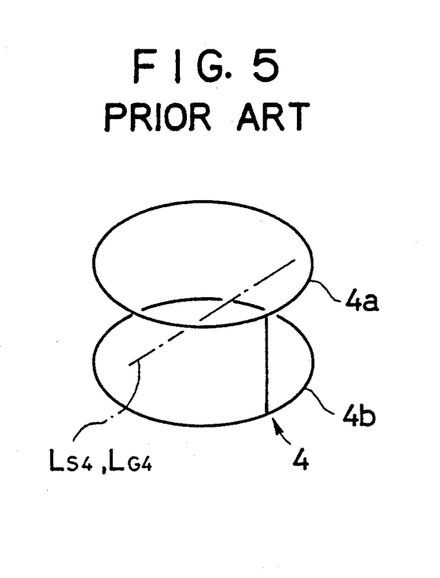
FIG. 5 is a perspective view of another example of a conventional receiver coil.

Another example of a conventional receiver coil is shown in FIG. 5, which is called a Helmholtz coil, and this receiver coil 4 comprises a pair of circular coil elements 4a and 4b arranged with a prescribed separation formed therebetween. In this configuration, a sensitivity central axis $L_{S4}$ of a region of uniform signal reception sensitivity and a central axis $L_{G4}$ passing between the circular coil elements 4a and 4b also coincide with each other.

Figure 6:
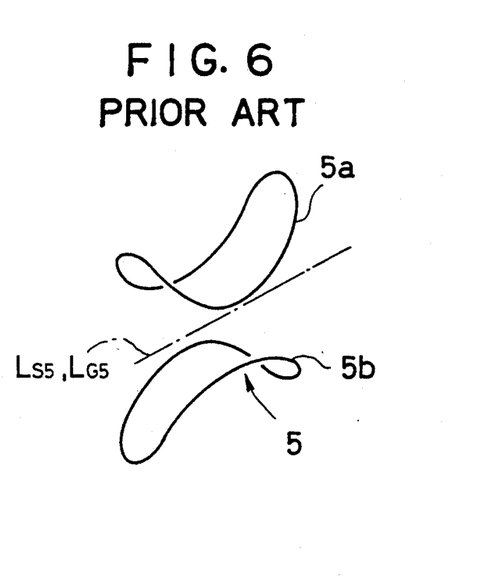
FIG. 6 is a perspective view of another example of a conventional receiver coil.

Another example of a conventional receiver coil is shown in FIG. 6, which is called a modified Helmholtz coil, and this receiver coil 5 comprises a pair of warped circular coil elements 5a and 5b arranged with a prescribed separation formed therebetween. In this configuration, a sensitivity central axis $L_{S5}$ of a region of uniform signal reception sensitivity and a central axis $L_{G5}$ passing between the circular coil elements 5a and 5b coincide with each other, as in the last example.

In all of these examples, the coil elements are supported by a core member formed by a non-magnetic resinous supporting material which maintains the geometrical configuration of the coil elements.

Now, in these conventional receiver coils, the region of uniform signal reception sensitivity is a space formed in an opening section of the coil elements. The condition for a satisfactory signal reception is to make this region as large as a region of interest to be imaged, and to place this region of interest at a center of the region of uniform signal reception sensitivity.

Figure 7:
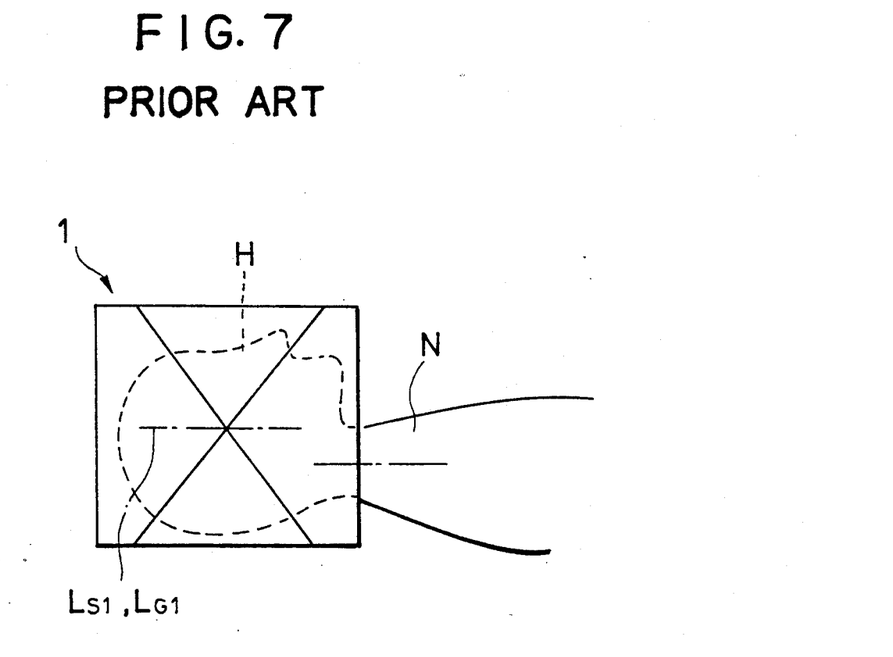
FIG. 7 is a side view of the receiver coil of FIGS. 1(A) and 1(B), for explaining its operation in imaging a head portion.
Figure 8:
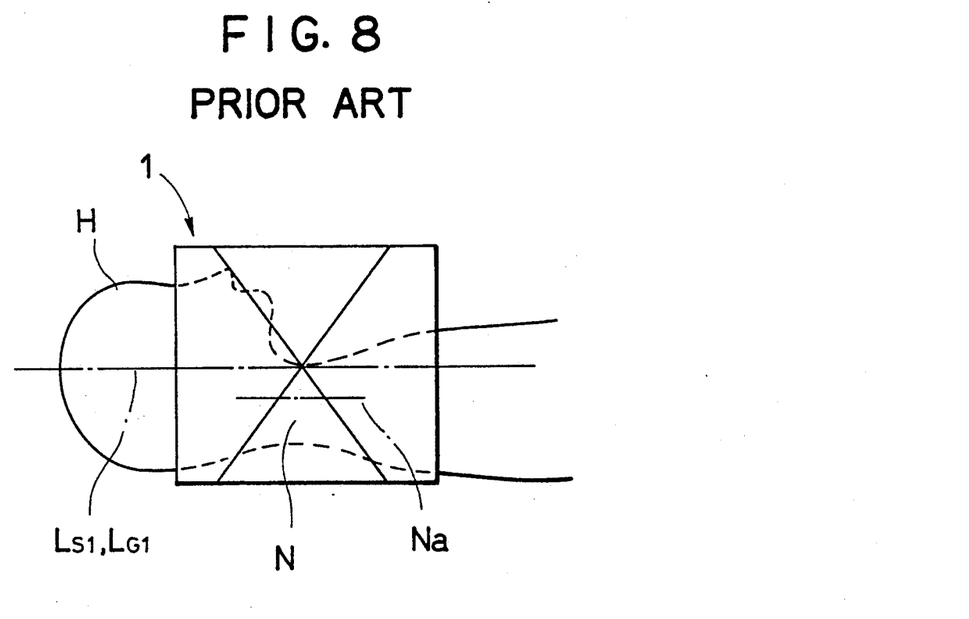
FIG. 8 is a side view of the receiver coil of FIGS. 1(A) and 1(B), for explaining its operation in imaging a neck portion.

As an example, the operation of the receiver coil 1 of FIGS. 12(A) and 12(B) will now be described with references to FIGS. 17 and 18.

This receiver coil 1 is one for imaging head and neck portions, and has a diameter of opening section approximately equal to 260 mm, such that it can be used for both an imaging of a head portion and an imaging of a neck portion.

As shown in FIG. 17, in a case of imaging the head portion H, the head portion H is inserted inside the opening section of the receiver coil 1 completely. In this case, the region of uniform signal reception sensitivity coincide with a size of the head portion H, and a center of the head portion H is located on the sensitivity central axis $L_{S1}$ of the receiver coil 1, so that the condition for the satisfactory signal reception is fulfilled, i.e., the nuclear magnetic signals can be received with a high S/N ratio.

However, as shown in FIG. 18, in a case of imaging the neck portion N, when the neck portion N is inserted inside the opening section of the receiver coil 1 completely, the central axis Na of the neck portion N is located below the sensitivity central axis $L_{S1}$ of the receiver coil 1, so that the condition for the satisfactory signal reception cannot be fulfilled completely, i.e., the nuclear magnetic signals can be received only with a low S/N ratio.

Thus, in a conventional receiver coil, because the coil elements are wound such that the sensitivity central axis and the central axis of the opening section coincide with each other, the condition for a satisfactory signal reception cannot be fulfilled completely for the imaging of a region of interest that cannot be placed symmetrically with respect to the central axis of the receiver coil such as a neck portion. In particular, the neck portion usually ends up being placed off the sensitivity central axis of a conventional receiver coil, so that the quality of the imaging of the neck portion has usually been poorer.

SUMMARY OF THE INVENTION

It is therefore an object of the present invention to provide a receiver coil for a nuclear magnetic resonance imaging apparatus, capable of fulfilling the condition for a satisfactory signal reception completely for the imaging of a region of interest that cannot be placed symmetrically with respect to the central axis of the receiver coil, such as a neck portion.

According to one aspect of the present invention there is provided a receiver coil for a nuclear magnetic resonance imaging apparatus, comprising: coil element means for defining an opening section into which a region of interest is to be inserted, and for receiving a nuclear magnetic resonance signal from the region of interest; and coil support means for supporting the coil element means in a configuration in which a sensitivity central axis of a region of uniform signal reception sensitivity for the coil element means is located away from a central axis of the opening section.

According to another aspect of the present invention there is provided a receiver coil for a nuclear magnetic resonance imaging apparatus, comprising: coil element means for defining an opening section into which a region of interest is to be inserted, and for receiving a nuclear magnetic resonance signal from the region of interest; and coil support means for supporting the coil element means in a configuration corresponding to a shape of the region of of interest.

Other features and advantages of the present invention will become apparent from the following description taken in conjunction with the accompanying drawings.

DETAILED DESCRIPTION OF THE PREFERRED EMBODIMENTS

Figure 9A:
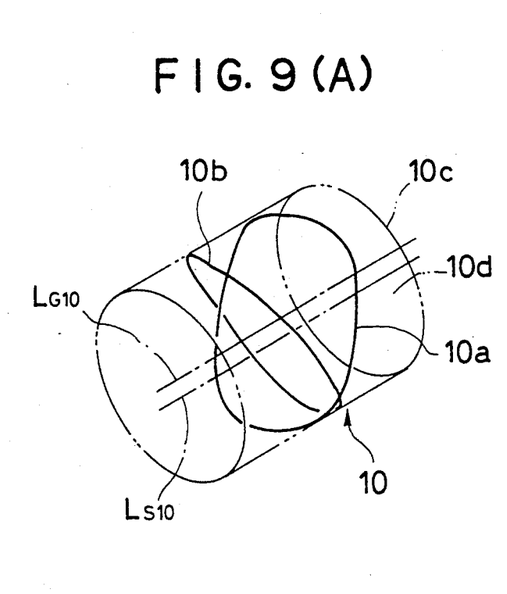
FIGS. 9(A) and 9(B) are a perspective view and a side view, respectively, of a first embodiment of a receiver coil according to the present invention.
Figure 9B:
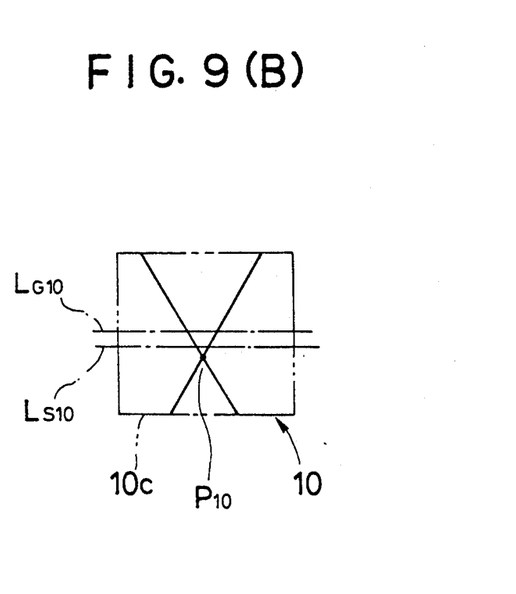

Referring now to FIGS. 9(A) and 9(B), a first embodiment of a receiver coil according to the present invention will be described.

This receiver coil 10 comprises a pair of elliptic coil elements 10a and 10b which are wound around a cylindrical core 10c and are arranged such that they are crossing with each other and electrically connected at cross sections $P_{10}$, where vertical positions of the cross sections $P_{10}$ is located below that of a central axis $L_{G10}$ of the cylindrical core 10c, as shown in FIG. 9(B).

In this configuration, a sensitivity central axis $L_{S10}$ of a region of uniform signal reception sensitivity is located below the central axis $L_{G10}$ of the cylindrical core 10c.

Thus, by placing a region of interest to be imaged inside an opening section 10d of the cylindrical core 10c, asymmetrically with respect to the central axis $L_{G10}$ of the cylindrical core 10c, a condition for a satisfactory signal reception can be fulfilled completely for an imaging of a region of interest that cannot be placed symmetrically with respect to the central axis $L_{G10}$ of the cylindrical core 10c.

Figure 10:
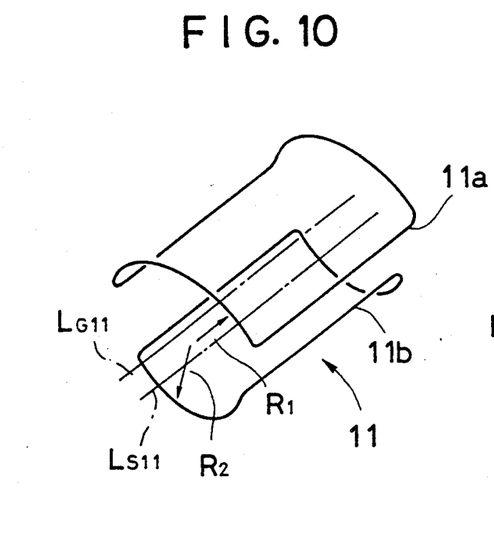
FIG. 10 is a perspective view of a second embodiment of a receiver coil according to the present invention.

Referring now to FIG. 10, a second embodiment of a receiver coil according to the present invention will be described.

This receiver coil 11 comprises a pair of saddle shaped coil elements 11a and 11b which are arranged such that they are facing each other, where the coil element 11a has curved portions along a circle of radius R1 while the coil element 11b has curved portions along a circle of radius R2 smaller than R1.

In this configuration, a sensitivity central axis $L_{S11}$ of a region of uniform signal reception sensitivity is located below a central axis $L_{G11}$ passing through a middle of the coil elements 11a and 11b.

Thus, by placing a region of interest to be imaged inside an opening section of the receiver coil 11 asymmetrically with respect to the central axis $L_{G11}$, a condition for a satisfactory signal reception can be fulfilled completely for an imaging of a region of interest that cannot be placed symmetrically with respect to the central axis $L_{G11}$.

Figure 11:
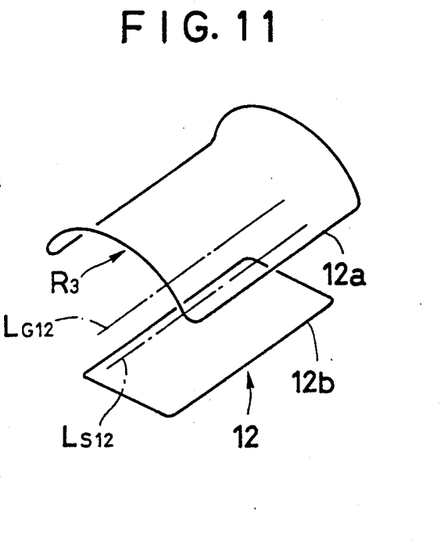
FIG. 11 is a perspective view of a third embodiment of a receiver coil according to the present invention.

Referring now to FIG. 11, a third embodiment of a receiver coil according to the present invention will be described.

This receiver coil 12 comprises a saddle shaped coil element 12a having curved portions along a circle of radius R3 and a rectangular coil element 12b which are arranged such that they are facing each other.

In this configuration, a sensitivity central axis $L_{S12}$ of a region of uniform signal reception sensitivity is located below a central axis $L_{G12}$ passing through a middle of the coil elements 11a and 11b.

Thus, by placing a region of interest to be imaged inside an opening section of the receiver coil 12 asymmetrically with respect to the central axis $L_{G12}$, a condition for a satisfactory signal reception can be fulfilled completely for an imaging of a region of interest that cannot be placed symmetrically with respect to the central axis $L_{G12}$.

Figure 12:
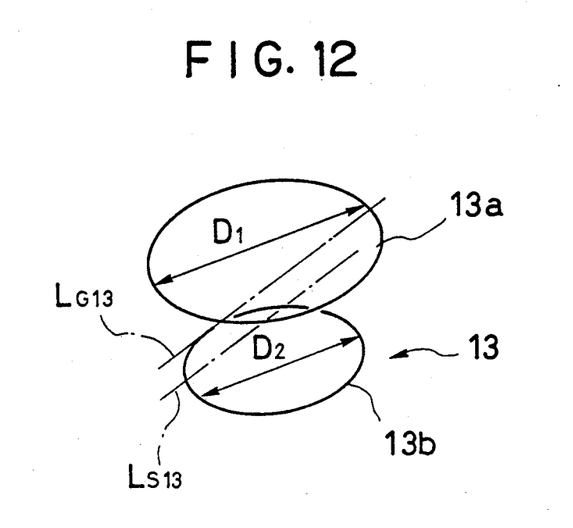
FIG. 12 is a perspective view of a fourth embodiment of a receiver coil according to the present invention.

Referring now to FIG. 12, a fourth embodiment of a receiver coil according to the present invention will be described.

This receiver coil 13 comprises a circular coil elements 13a and 13b which are arranged such that they are facing each other, where the coil element 13a has a shape of a circle of diameter D1 while the coil element 13b has a shape of a circle of diameter D2 smaller than D1.

In this configuration, a sensitivity central axis $L_{S13}$ of a region of uniform signal reception sensitivity is located below a central axis $L_{G13}$ passing through a middle of the coil elements 13a and 13b.

Thus, by placing a region of interest to be imaged inside an opening section of the receiver coil 13 asymmetrically with respect to the central axis $L_{G13}$, a condition for a satisfactory signal reception can be fulfilled completely for an imaging of a region of interest that cannot be placed symmetrically with respect to the central axis $L_{G13}$.

Figure 13:
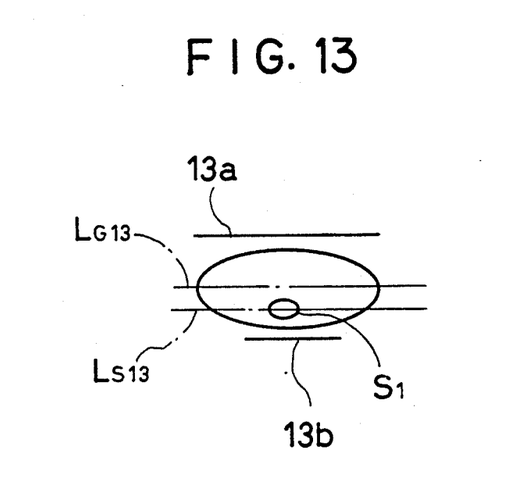
FIG. 13 is a vertical cross sectional view of the receiver coil of FIG. 12, for explaining its operation in imaging a spine.

Namely, as shown in FIG. 13, in imaging a spine S1, this spine S1 can be placed on the sensitivity central axis $L_{S13}$ by placing a patient between the coil elements 13a and 13b, with a face up. In this manner, the nuclear magnetic resonance image of the spine S1 can be obtained with a high S/N ratio.

Figure 14:
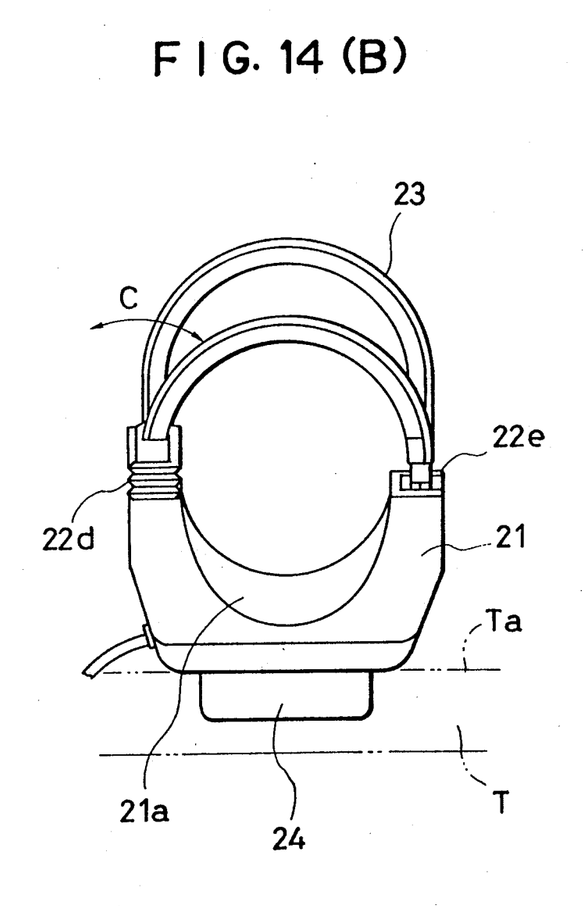
FIGS. 14(A) and 14(B) are a side view and a front view, respectively, of a fifth embodiment of a receiver coil according to the present invention.

Referring now to FIGS. 14(A) and 14(B), a fifth embodiment of a receiver coil according to the present invention will be described.

This receiver coil 20, which is a specialized one for imaging a neck portion, comprises a head rest unit 21 having a head rest surface 21a; a coil unit 22 having a pair of elliptic coil elements 22a and 22b, which are wound around a virtual cylindrical core 22c and are arranged such that they are crossing with each other and electrically connected at cross sections $P_{20}$; a coil support unit 23 for supporting the coil elements 22a and 22b such that they are crossing with each other with a vertical position of the cross sections $P_{20}$ located below that of a central axis $L_{G20}$ of the virtual cylindrical core 22c; and a receiver coil attachment unit 24 for detachably attaching the receiver coil 20 to a bed T.

In this configuration, a sensitivity central axis $L_{S20}$ of a region of uniform signal reception sensitivity is located below the central axis $L_{G20}$ of the virtual cylindrical core 22c, as shown in FIG. 14(A).

The coil unit 22 has a pivotal crossing section 22d and an openable crossing section 22e, such that the coil support unit 23 can be opened up in a direction of an arrow C by lifting the openable crossing section 22e around the pivotal crossing section 22d. The coil support unit 23 is opened in this manner when the patient is to be placed on the head rest unit 21, and then closed when the patient is placed on the head rest unit 21.

The virtual cylindrical core 22c has a gradually increasing diameter toward an end in a direction of an arrow D, which is a side on which a head of the patient is to be place, and the central axis $L_{G20}$ of this virtual cylindrical core 22c has an angle of $\theta$ formed with respect to a top surface Ta of the bed T.

The coil support unit 23 has a hard portion made of a resinous material formed around an outer edge of the coil support unit 23 so as to provide a strength to maintain the geometrical configuration of the coil elements 22a and 22b, and a soft portion made of a foaming material formed around an inner edge of the coil support unit 23 to which the patient may make a contact, such that a comfortable touch can be provided to the patient. In this embodiment, the coil support unit 23 is formed in a shape of the coil elements 22a and 22b, so as to provide a feeling of openness to the patient.

The operation of this receiver coil 20 will now be described with references to FIGS. 15 and 16.

First, the receiver coil 20 is attached to the bed T by means of the receiver coil attachment unit 24.

Then, the coil support unit 23 is opened up by lifting the openable crossing section 22e of the coil unit 22, the head H of the patient is placed on the head rest unit 21, and the coil support unit 23 is closed.

Figure 15:
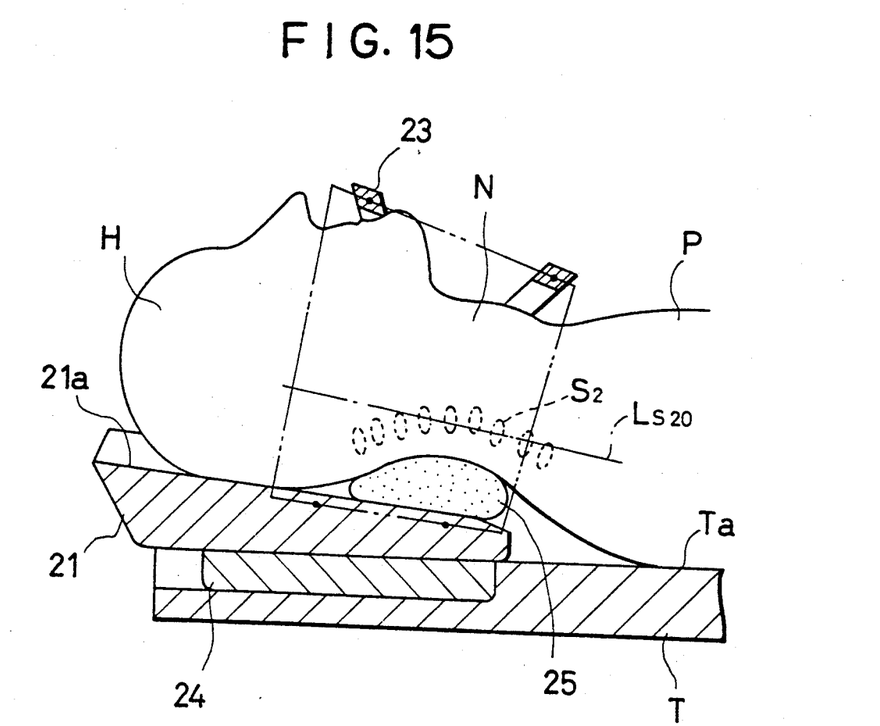
FIG. 15 is a side view of the receiver coil of FIGS. 14(A) and 14(B), for explaining its operation in imaging a neck portion.

In a case of imaging with a backward bending posture, as shown in FIG. 15, a neck portion supporter 25 is inserted below a neck portion N of the patient P, such that a spine $S_2$ at the neck portion N in the backward bending posture can be placed on the sensitivity central axis $L_{S20}$ of a region of uniform signal reception sensitivity. Thus, in this arrangement, the nuclear magnetic resonance signals from the spine $S_2$ at the neck portion N can be collected with a high S/N ratio.

Figure 16:
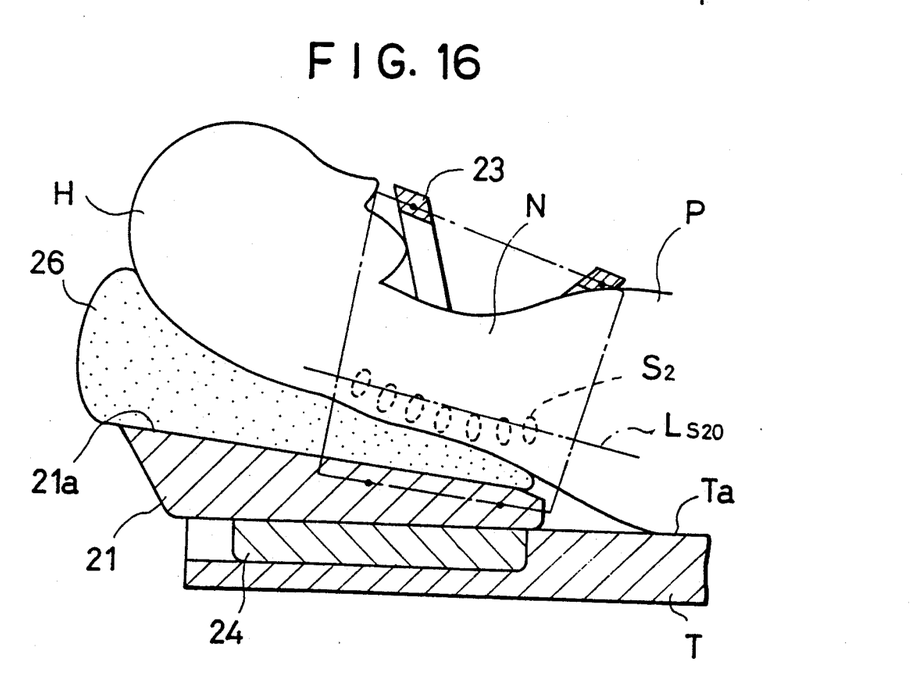
FIG. 16 is another side view of the receiver coil of FIGS. 14(A) and 14(B), for explaining its operation in imaging a neck portion.

In a case of imaging with a forward bending posture, as shown in FIG. 16, a head portion supporter 26 is inserted below the head portion H of the patient P, such that the spine $S_2$ at the neck portion N in the forward bending posture can be placed on the sensitivity central axis $L_{S20}$ of a region of uniform signal reception sensitivity. Thus, in this arrangement, the nuclear magnetic resonance signals from the spine $S_2$ at the neck portion N can be collected with a high S/N ratio.

Figure 17:
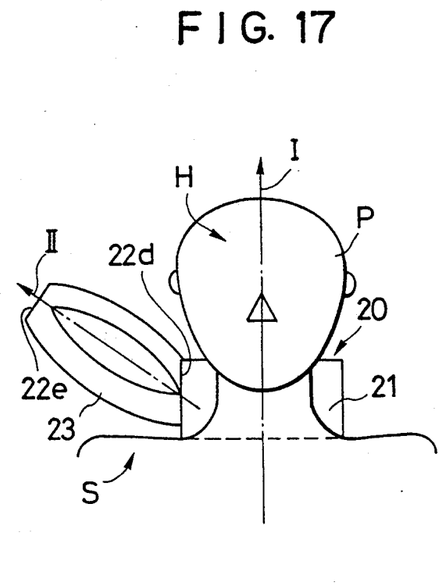
FIG. 17 is a top plan view of the receiver coil of FIGS. 14(A) and 14(B), for explaining its operation of opening a coil support unit.

Now, in this embodiment, as shown in FIG. 17, the coil support unit 23 opens up in a direction II pointing between the head portion H and a shoulder portion S of the patient P, which is not perpendicular to a body axis I of the patient P. This structure is adopted because, in positioning the patient P on the head rest unit 21, if the coil support unit 23 were to open in a direction perpendicular to the body axis I, the opened coil support unit 23 would interfere with the shoulder portion S of the patient P, such that not only the positioning of the patient P becomes time-consuming but also an unnecessary pressure is exerted on the coil support unit 23 which may causes a deformation of the coil unit 22. By making the coil support unit 23 to open in a direction II, this problem can be eliminated.

Figure 18:
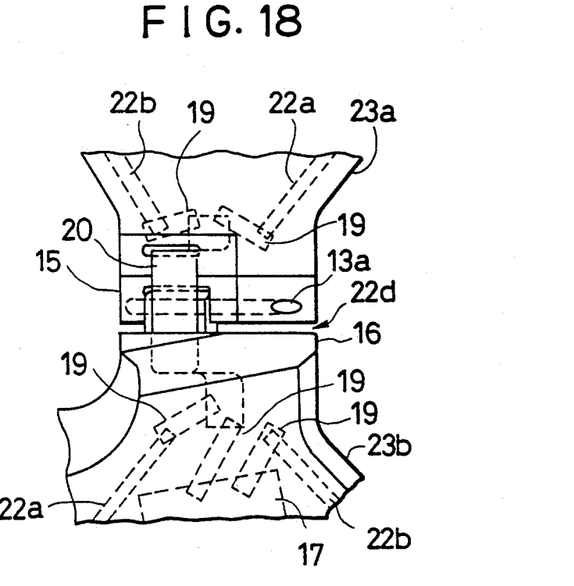
FIG. 18 is an enlarged view of a pivotal crossing section of the receiver coil of FIGS. 14(A) and 14(B).

In order to provide this opening of the coil support unit 23 in an oblique direction, the pivotal crossing section 22d of the coil unit 22 has a detail configuration shown in FIG. 18. Namely, at the pivotal crossing section 22d, an upper part 23a and a lower part 23b of the coil support unit 23 are held together by a hinge structure formed by an upper attaching member 15 provided on the upper part 23a and a lower attaching member 16 provided on the lower part 23b. The coil elements 22a and 22b in the upper part 23a and the lower part 23b are electrically connected through a connector plate 20 provided inside the pivotal crossing section 22d, which makes contact with connector plates 19 attached to their ends, such that a closed loop is formed. Inside the lower part 23b, there is also provided a circuit connector plate 17 which connects the closed loop with circuits of a nuclear magnetic resonance imaging apparatus.

Figure 19:
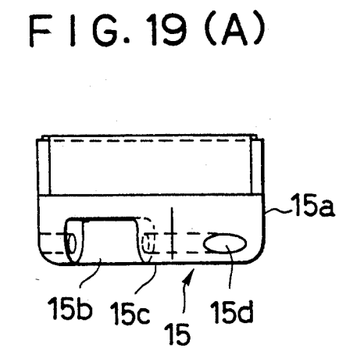
FIGS. 19(A) and 19(B) are a side view and a top view, respectively, of an upper attaching member in the pivotal crossing section of FIG. 18.
Figure 20:
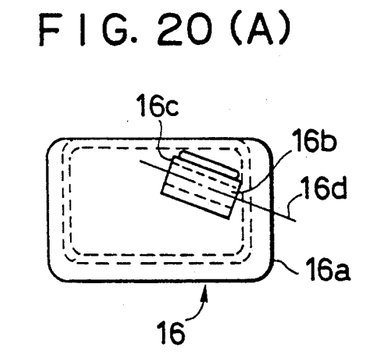
FIGS. 20(A) and 20(B) are a top view and a side view, respectively, of a lower attaching member in the pivotal crossing section of FIG. 18.

The upper attaching member 15 has a structure shown in FIGS. 19(A) and 19(B) which includes a base 15a, a cut 15b and a hole 15d provided along an oblique face 15c, while the lower attaching member 16 has a structure shown in FIGS. 20(A) and 20(B) which includes a base 16a, a protrusion 16c provided obliquely to the base 16 which is to be engaged into the cut 15b of the upper attaching member 15 and which has a hole 16b to be continuous with the hole 15d of the upper attaching member 15 when the protrusion 16c is engaged into the cut 15b. These holes 15d and 16b are provided along a direction II appeared in FIG. 17. The protrusion 16c and the cut 15b are relatively fixed by means of a pin 13a piercing through the holes 15d and 16b. Thus, when the upper part 23a is lifted up, this upper part 23a rotates around the pin 13a, into the direction II appeared in FIG. 17.

It is to be noted that this feature of oblique opening of the coil support unit 23 may be equally beneficial in the imaging of a portion other than a neck portion, such as those of a chest portion, a lower stomach portion, or any portion in a vicinity of severe wound.

It is also noted that the pivotal crossing section 22d of the above embodiment can be modified to be also openable such that the upper part 23a of the coil support unit 23 becomes completely detachable and the lower part 23b alone with the upper part 23a detached can be used as a receiver coil. The use of the lower part 23b alone has the advantages of reducing the artefact, improving the Q value of the receiver coil, and making the receiver coil to be adaptable to a larger region of interest.

Figure 21:
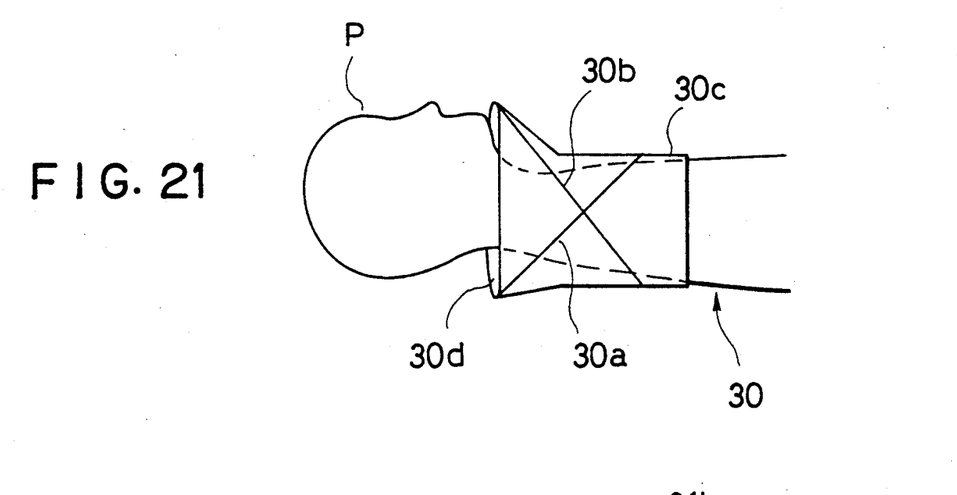
FIG. 21 is a side view of a sixth embodiment of a receiver coil according to the present invention.

Referring now to FIG. 21, a sixth embodiment of a receiver coil according to the present invention will be described.

This receiver coil 30, which is a specialized one for the imaging of a neck portion, comprises a pair of elliptic coil elements 30a and 30b which are wound around a core 30c having a tapering end portion 30d which has an increasing diameter toward the head portion of the patient in correspondence with the shape of the patient, such that the coil elements 30a and 30b can be placed closer to the neck portion of the patient P.

Figure 22:
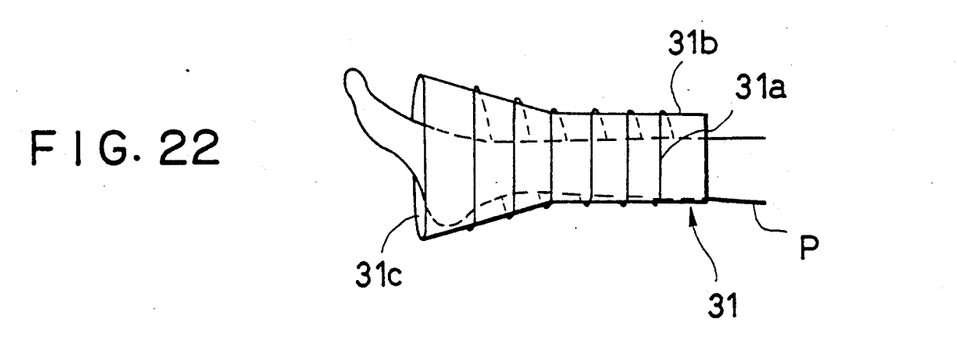
FIG. 22 is a side view of a seventh embodiment of a receiver coil according to the present invention.

Referring now to FIG. 22, a seventh embodiment of a receiver coil according to the present invention will be described.

This receiver coil 31, which is a specialized one for the imaging of a leg portion, comprises a solenoid coil element 31a which is wound around a core 31b having a tapering end portion 31c which has an increasing diameter toward a foot portion of the patient in correspondence with the shape of the patient, such that the coil element 31a can be placed closer to the leg portion of the patient P.

Figure 23:
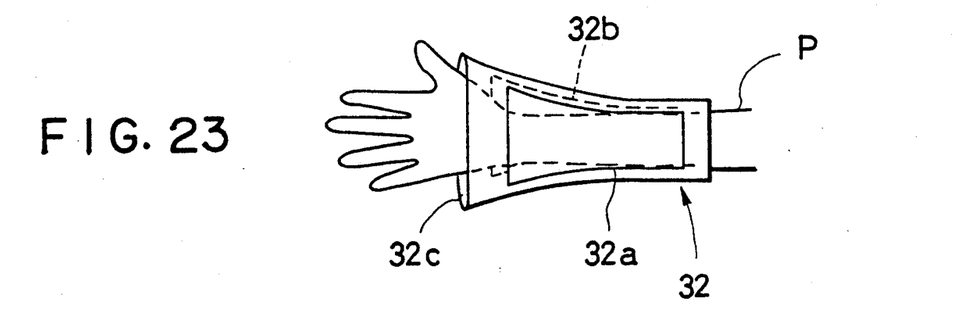
FIG. 23 is a side view of a eighth embodiment of a receiver coil according to the present invention.

Referring now to FIG. 23, an eighth embodiment of a receiver coil according to the present invention will be described.

This receiver coil 32, which is a specialized one for the imaging of a forearm portion, comprises a saddle shaped coil element 32a which is wound around a core 32b having a tapering end portion 32c which has an increasing diameter toward a hand portion of the patient in correspondence with the shape of the patient, such that the coil element 32a can be placed closer to the forearm portion of the patient P.

It is to be noted that, although the above embodiments have been described as those of a receiver coil, they can be modified in a usual manner to make them operate as a receiver and transmitter coil.

Besides those already mentioned, many modifications and variations of the above embodiments may be made without departing from the novel and advantageous features of the present invention. Accordingly, all such modifications and variations are intended to be included within the scope of the appended claims.

What is claimed is:

1. A receiver coil for a nuclear magnetic resonance imaging apparatus, comprising:

coil element means for defining an opening section into which a region of interest is to be inserted, and for receiving a nuclear magnetic resonance signal from the region of interest; and coil support means for supporting the coil element means in a configuration in which a sensitivity central axis of a region of uniform signal reception sensitivity for the coil element means is located away from a central axis of the opening section.

2. The receiver coil of the claim 1, wherein the coil element means comprises a pair of coil elements having different sizes which are supported in a configuration to be facing with each other by the coil support means.

3. The receiver coil of the claim 1, wherein the coil element means comprises a pair of elliptic coil elements, which are wound to be crossing with each other and to define the opening section in an approximately cylindrical shape, in a configuration in which vertical positions of cross sections of the elliptic coil elements are located away from a vertical position of a central axis of the opening section.

4. The receiver coil of claim 3, wherein the elliptic coil elements have a hinge structure at one of the cross sections, and an openable structure at another one of the cross sections, such that the coil support means can be opened up.

5. The receiver coil of claim 4, wherein the coil support means is capable of opening up in a direction not perpendicular to a central axis of the region of interest.

6. The receiver coil of claim 3, wherein the elliptic coil elements have openable structures at the cross sections, such that an upper part of the coil support means can be detached completely from a lower part of the coil support means.

7. The receiver coil of claim 3, wherein the coil support means is inclined by a prescribed angle with respect to a horizontal plane.

8. The receiver coil of claim 3, wherein the coil support means has an approximately similar shape as the elliptic coil elements.

9. The receiver coil of claim 3, wherein the opening section defined by the elliptic coil elements has a gradually increasing diameter in a direction of the central axis of the opening section.

10. A receiver coil for a nuclear magnetic resonance imaging apparatus, comprising:

coil element for defining an opening section into which a region of interest is to be inserted, and for receiving a nuclear magnetic resonance signal from the region of interest; and coil support means for supporting the coil element means in a configuration corresponding to a shape of the region of interest, in which a sensitivity central axis of a region of uniform signal reception sensitivity for the coil element means is located away from a central axis of the opening section.

11. The receiver coil of the claim 10, wherein the coil element means comprises a pair of coil elements having different sizes which are supported in a configuration to be facing with each other by the coil support means.

12. The receiver coil of the claim 10, wherein the coil element means comprises a pair of elliptic coil elements, which are wound to be crossing with each other and to define the opening section in an approximately cylindrical shape, in a configuration in which vertical positions of cross sections of the elliptic coil elements are located away from a vertical position of a central axis of the opening section.

13. The receiver coil of claim 12, wherein the elliptic coil elements have a hinge structure at one of the cross sections, and an openable structure at another one of the cross sections, such that the coil support means can be opened up.

14. The receiver coil of claim 13, wherein the coil support means is capable of opening up in a direction not perpendicular to a central axis of the region of interest.

15. The receiver coil of claim 12, wherein the elliptic coil elements have openable structures at the cross sections, such that an upper part of the coil support means can be detached completely from a lower part of the coil support means.

16. The receiver coil of claim 12, wherein the coil support means is inclined by a prescribed angle with respect to a horizontal plane.

17. The receiver coil of claim 12, wherein the coil support means has an approximately similar shape as the elliptic coil elements.

18. The receiver coil of claim 12, wherein the opening section defined by the elliptic coil elements has a gradually increasing diameter in a direction of the central axis of the opening section.

* * * * *